(12) United States Patent
Parker et al.

(10) Patent No.: US 7,362,106 B2
(45) Date of Patent: *Apr. 22, 2008

(54) METHODS AND APPARATUS FOR NON-CONTACT TESTING AND DIAGNOSING OF OPEN CONNECTIONS ON NON-PROBED NODES

(75) Inventors: Kenneth P. Parker, Ft. Collins, CO (US); Myron J. Schneider, Ft. Collins, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/170,365

(22) Filed: Jun. 29, 2005

(65) Prior Publication Data

US 2007/0001686 A1   Jan. 4, 2007

(51) Int. Cl.
   *G01R 31/08*   (2006.01)
   *G01R 27/26*   (2006.01)
   *G01R 31/302*   (2006.01)
   *G01R 31/04*   (2006.01)

(52) U.S. Cl. ............ 324/519; 324/686; 324/750; 324/538

(58) Field of Classification Search ........ 324/519, 324/617, 538
See application file for complete search history.

(56) References Cited

U.S. PATENT DOCUMENTS

| | | | |
|---|---|---|---|
| 5,122,753 A * | 6/1992 | Myers et al. | 324/537 |
| 5,124,660 A | 6/1992 | Cilingiroglu | |
| 5,420,500 A | 5/1995 | Kerschner | |
| 5,432,460 A * | 7/1995 | Flecha et al. | 324/754 |
| 5,498,694 A | 3/1996 | Ruoslahti | |
| 5,557,209 A | 9/1996 | Crook et al. | |
| 5,736,862 A * | 4/1998 | Hamblin | 324/527 |
| 5,786,697 A * | 7/1998 | Khazam et al. | 324/537 |
| 6,600,325 B2 * | 7/2003 | Coates et al. | 324/519 |
| 6,717,415 B2 * | 4/2004 | Sunter | 324/519 |
| 6,975,978 B1 * | 12/2005 | Ishida et al. | 703/15 |
| 7,057,395 B1 * | 6/2006 | Williamson | 324/519 |
| 7,075,307 B1 * | 7/2006 | Williamson | 324/519 |
| 7,208,957 B2 * | 4/2007 | Schneider et al. | 324/519 |

* cited by examiner

*Primary Examiner*—Andrew H. Hirshfeld
*Assistant Examiner*—Jeff Natalini

(57) ABSTRACT

A method and apparatus for detecting open defects on non-probed node under test of an electrical device using capacitive lead frame technology is presented. In accordance with the method of the invention, a probed node neighboring the non-probed node under test is stimulated with a known source signal. A sensor of a capacitive sensing probe is capacitively coupled to at least the probed node and non-probed node under test of the electrical device, and a measuring device coupled to the capacitive sensing probe measures a capacitively coupled signal present between the sensor of the probe and at least the probed and non-probed node of the electrical device. Based on the value of the capacitively sensed signal, a known expected "defect-free" capacitively sensed signal measurement and/or a known expected "open" capacitively sensed signal measurement, a determination is made of whether an open defect exists on the non-probed node under test of the electrical device.

21 Claims, 5 Drawing Sheets

S closed: Good Connection
S open: Open Connection

METHODS AND APPARATUS FOR NON-CONTACT TESTING AND DIAGNOSING OF OPEN CONNECTIONS ON NON-PROBED NODES

BACKGROUND OF THE INVENTION

The present invention relates generally to integrated circuit testing, and more particularly to a method and apparatus for non-contact testing and diagnosing of inaccessible open integrated circuit connections.

Integrated circuit assemblies are ubiquitous in modern electronic devices, and a large portion of the industrial sector is devoted to the design and manufacture of such devices. As electronic devices are continually being improved and becoming more sophisticated, so are consumers' expectations for the level of quality of these products. Accordingly, new and improved testing techniques are continuously being sought by manufacturers to test the quality of integrated circuits, printed circuit boards, and integrated circuit assemblies after manufacture and prior to shipment of these devices. While testing entails checking many aspects of the product, such as functionality testing and burn-in testing, one of the most important tests after manufacture is basic continuity testing—that is, testing to ensure that all connections that are supposed to be connected between components of the device (e.g., integrated circuit pins to printed circuit boards, integrated circuit lead wires to pins, traces connections between printed circuit board nodes, etc.) are intact.

One common defect often uncovered during continuity testing is known as an "open" defect. In an open defect, an electrical connection is missing between two points in the circuit where electrical continuity should exist. Open defects typically result from problems in the manufacturing process, such as missing solder due to uneven application of solder paste, the unintentional introduction of particles in the wetting process, etc. Thus, during continuity testing of integrated circuit assemblies, connection defects such as open solder joints are diagnosed.

Detection of open defects is often performed using well-known capacitive lead-frame sensing technologies. For example, U.S. Pat. No. 5,557,209 to Crook et al, U.S. Pat. No. 5,498,964 to Kerschner et al., U.S. Pat. No. 5,420,500 to Kerschner, U.S. Pat. No. 5,254,953 to Crook et al., and U.S. Pat. No. 5,124,660 to Cilingiroglu, all of which are hereby incorporated by reference for all that they teach, describe techniques for detecting opens between integrated circuit signal pins and the mounting substrate (typically a printed circuit board). In other related art, U.S. Patent Application Serial Number UNKNOWN, entitled "Methods And Apparatus For Non-Contact Testing And Diagnosing Open Connections" to Parker et al., filed on Apr. 28, 2004, and assigned to the assignee of interest herein provides a method for testing for open power and ground connections in connectors and sockets, by making use of the inherently available coupling capacitors that exist between connector pins. When a signal pin is tested that is coupled to a nearby ground pin, an open on that ground pin will cause the signal pin measurement to rise in value.

For better understanding of the invention, a brief introduction to capacitive lead frame testing techniques is now presented. Turning to the drawings, FIG. 1A shows the traditional setup and FIG. 1B shows the equivalent circuit model of capacitive lead-frame testing for open signal pins on an integrated circuit.

As shown, an integrated circuit (IC) die 18 is packaged in an IC package 12. The package 12 includes a lead frame 14 supporting a plurality of pins 10a, 10b. Pads of the IC die 18 are connected to the package pins 10a, 10b at the lead frame 14 via bond wires 16a, 16b. The pins 10a, 10b are supposed to be conductively attached, for example by way of solder joints, to pads 8a, 8b of a printed circuit board (PCB) 6. The test setup shown in FIG. 1A determines whether package pins are properly connected to the board at the solder joints. The test setup includes an alternating current (AC) source 2 that applies an AC signal, through a test probe 4a, to a node connected to the pad 8a on the PCB 6 to which a pin under test 10a should be electrically connected. In a typical test environment, the AC signal is typically ten kilohertz (10 kHz) at 0.2 volts. A capacitive sensing probe 20 comprising a conductive sense plate 22 and amplifying buffer 24 is placed on top of the integrated circuit package 12. The capacitive sensing probe 20 is connected to a current measuring device 26, such as an ammeter. Another pin 10b of the integrated circuit 12 is connected to a circuit ground via a grounded probe 4b.

When the test is performed, the AC signal applied to pad 8a appears on the pin 10a of the integrated circuit package 12. Through capacitive coupling, in particular a capacitance $C_{sense}$ formed between the lead frame 14 and sense plate 22, a current $I_s$ flows to the sense plate 22 and then through the amplifying buffer 24 to the current measuring device 26. If the measured current $I_s$ falls between predetermined limits, then the pin 10a is properly connected to the pad 8a. If the pin 10a is not connected to the pad 8a, a capacitance $C_{open}$ is formed between the pad 8a and pin 10a, altering the current $I_s$ measured by the current measuring device 26 such that the measured current $I_s$ falls outside the predetermined limits, thereby indicating that an open defect is present at the pin connection.

In some cases, however, for example due to an excess of number of nodes on the device under test to be tested relative to the number of tester interface pins, some nodes on the device under test may be "inaccessible" to the tester for testing during a given test. Therefore, it would be desirable to have a capacitive lead-frame technique for detecting open defects on inaccessible, or otherwise non-probed, nodes of an electrical device under test.

SUMMARY OF THE INVENTION

The present invention is a method for detecting open defects on non-probed nodes under test (for example, nodes inaccessible by the tester and/or nodes purposely selected not to be probed) (e.g., integrated circuit pins) of an electrical device (e.g., an integrated circuit), using capacitive lead frame technology. In accordance with the method of the invention, a probed node neighboring the non-probed node under test is stimulated with a known source signal. A sensor of a capacitive sensing probe is capacitively coupled to at least the probed node and the non-probed node under test of the electrical device, and a measuring device coupled to the capacitive sensing probe measures a capacitively coupled signal present between the capacitive sense plate and both the probed node and non-probed node under test of the electrical device. The capacitively sensed signal is representative of the effective capacitance between the probed node and non-probed node. Based on the value of the capacitively sensed signal, a known expected "defect-free" capacitively sensed signal measurement and/or a known expected "open" capacitively sensed signal measurement, one can determine whether an open defect exists on the non-probed node under test of the electrical device. In one embodiment, the known expected "defect-free" capacitively sensed signal measurement and/or known expected "open" capacitively sensed signal measurement are determined from measurements made on known good boards and boards with the known defect present, respectively. In another embodiment, the known expected "defect-free" capacitively sensed signal measurement and/or known expected "open" capacitively sensed signal measurement are calculated from circuit models of the electrical device without a defect and with an open circuit on the non-probed node under test, respectively.

The technique of the invention may be applied to infer the presence or non-presence of an open defect on non-probed nodes, which may be applied to detect open defects on inaccessible nodes and/or to increase test coverage or reduce test time by purposely selecting certain nodes for non-probing whose status can be inferred by measurements made on neighboring probed nodes.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

The present invention will be described in detail with reference to illustrative embodiments wherein the device under test is an integrated circuit and the probed nodes and non-probed nodes under test include input and/or output joints (taking the form of pads, pins, wire bonds, solder bumps, and/or other now-known or hereinafter developed electrical interconnects for joining input and/or output nodes of an integrated circuit to a printed circuit board). It will be appreciated that the present invention may be similarly applied to other types of electrical devices or circuit components (e.g., connectors and sockets) and nodes therein. The illustrative embodiments are presented by way of example only and not limitation, and it is intended that the invention be limited only by the claims.

As used herein, the term "node" refers to the conductive portion of an electrical device that forms a single electrical point in the equivalent schematic diagram of the electrical device. A node can be a pad of an integrated circuit die, a pin, a wire, a solder bump, or other interconnecting joint of an integrated circuit device, a pad or trace of a printed circuit board, an interconnecting joint of a component on the printed circuit board, or any combination thereof.

Figure 1A:
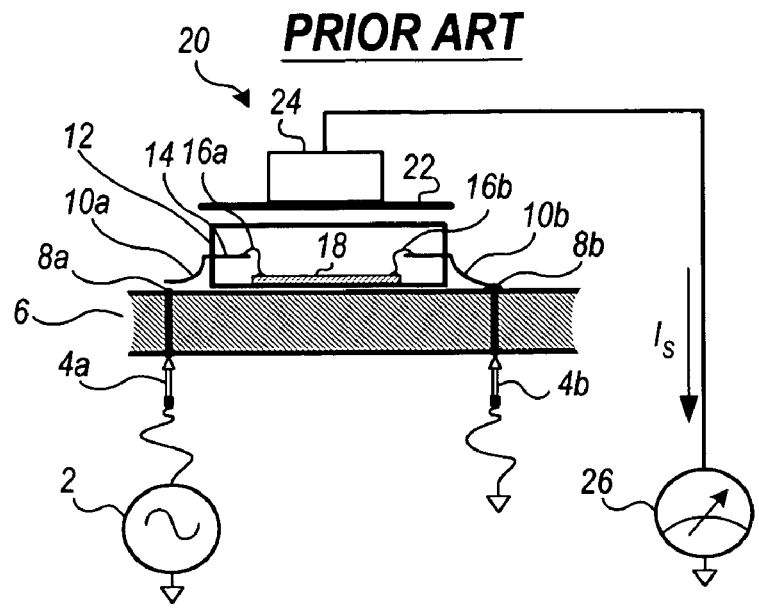
FIG. 1A is a cross-sectional side view of a basic test setup for testing for open signal pins on an integrated circuit using conventional capacitive lead-frame testing techniques.
Figure 1B:
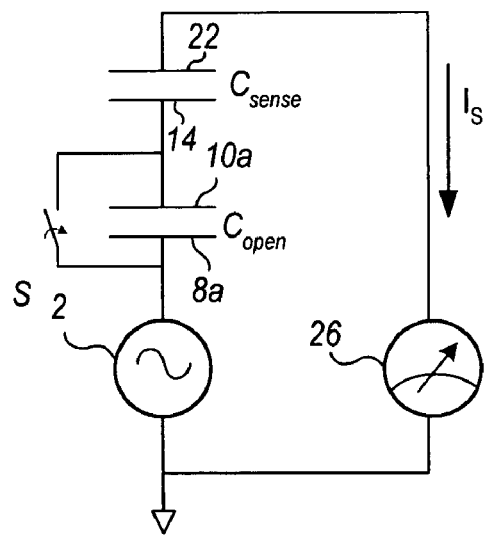
FIG. 1B is a schematic diagram illustrating the equivalent circuit of the test setup of FIG. 1A.
Figure 2:
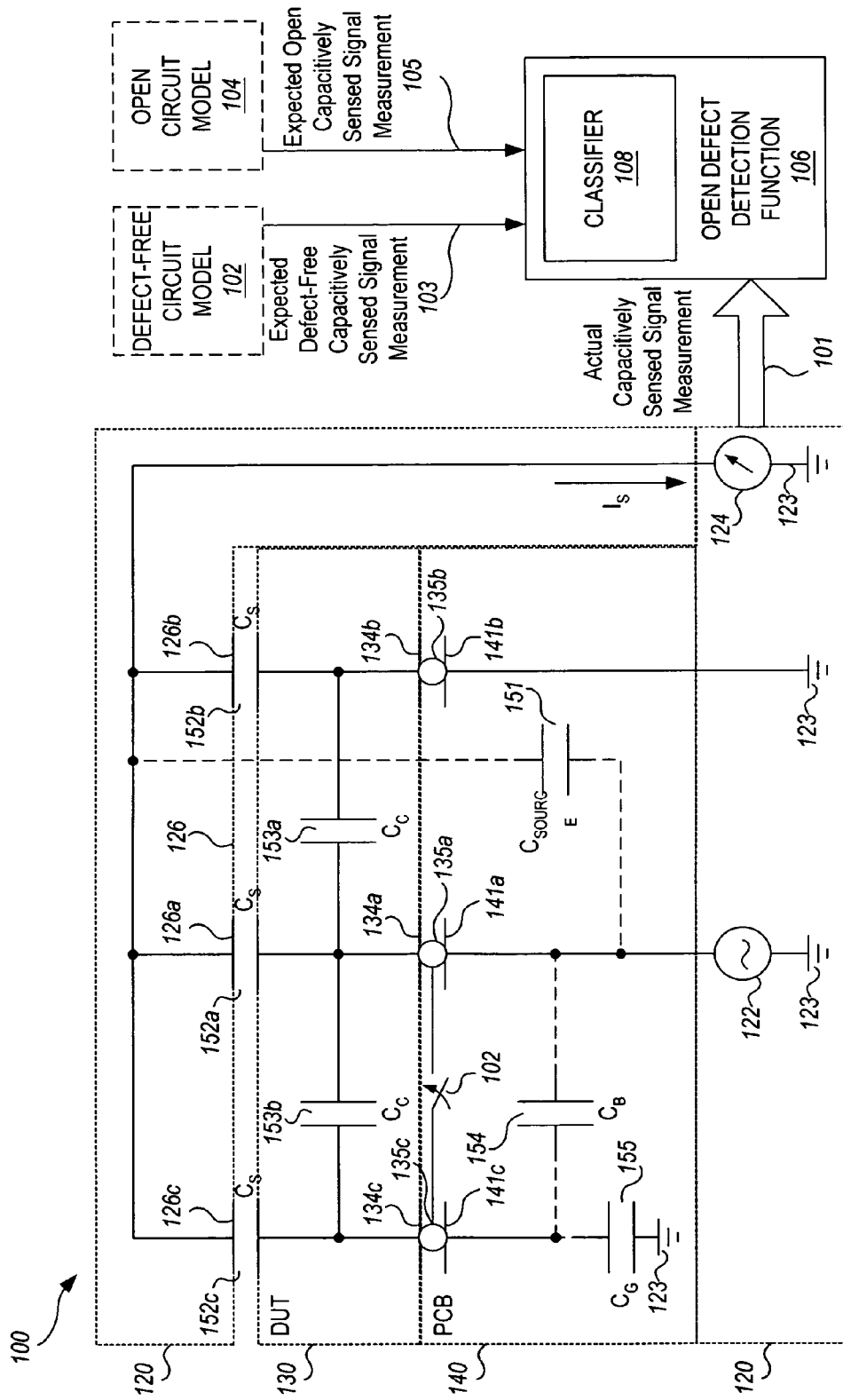
FIG. 2 is a schematic diagram of a test setup for testing for open defects on non-probed nodes of an integrated circuit using capacitive lead-frame testing techniques in accordance with the invention.

Turning now to the invention, FIG. 2 illustrates a test setup 100 in accordance with the invention where a device under test 130 is connected to a board 140 with solder joints 135a, 135b, 135c. A capacitive sense plate 126 sits on or in close proximity above the device under test 130 and couples to each joint 135a, 135b, 135c with a sense capacitance $C_s$ 152a, 152b, 152c. Joints 135a, 135b, 135c are coupled to nearby neighbors via respective coupling capacitances $C_c$ 153a, 153b. Some amount of parasitic capacitive coupling $C_{Source}$ 151 from the board 140 to the sense plate 126 exists that allows some of the source signal to appear on the sense plate 126. It is assumed that the current contributed by capacitance $C_{Source}$ 151 does not dominate the measurement, so it can be ignored. (The current contributed by capacitance $C_{source}$ 151 would only dominate the measurement if only the least significant bits of the measurement were indicative of currents not due to capacitance $C_{Source}$ 151).

Joint 135a is known to be properly electrically connected between node 134a on the DUT 130 and node 141a on the printed circuit board 140. Joint 135b is a nearby joint of joint 135a and is also known to be properly electrically connected between node 134b on the DUT 130 and node 141b on the printed circuit board 140. Joint 135b is guarded for testing by connecting it to the circuit ground 123. Joint 135c is a neighbor of joint 135a, but is either inaccessible for probing by the tester 120 or selected as non-probed by the tester 120, and therefore cannot be grounded. The invention allows testing for an open defect on joint 135c by virtue of its parasitic relationship to joint 135a.

As illustrated in FIG. 2, joint 135a couples to joint 135c inside the DUT 130 itself with a capacitance $C_c$ 153b. There is also some opportunity for capacitive coupling provided by the printed circuit board 140 itself, labeled $C_B$ 154. There is also likely to be a significant capacitance from the signal connected to joint 135c and ground, as indicated by label $C_G$ 155. Joint 135c and its associated wiring are responsible for the magnitudes of these capacitive couplings. There may be other devices also attached to this wiring. The present discussion considers the most likely case that this wiring only connects to joints of other integrated circuits. Since the capacitive lead-frame test technique uses very small stimulus voltages, these device joints cannot be forward-biased and therefore cannot consume any current themselves. If other devices such as passive components (e.g., termination resistors) are connected to this joint, then such other devices must be considered in a model of the circuit. However, for simplicity of analysis, devices such as passive components are not considered in the illustrative embodiment.

Consider two cases:
(1) Joint 135c is defect-free (i.e., is not open), as modeled at 102 in FIG. 3 (the defect-free model), and
(2) Joint 135c is open, as modeled at 104 in FIG. 4 (the open circuit model).

Figure 3:
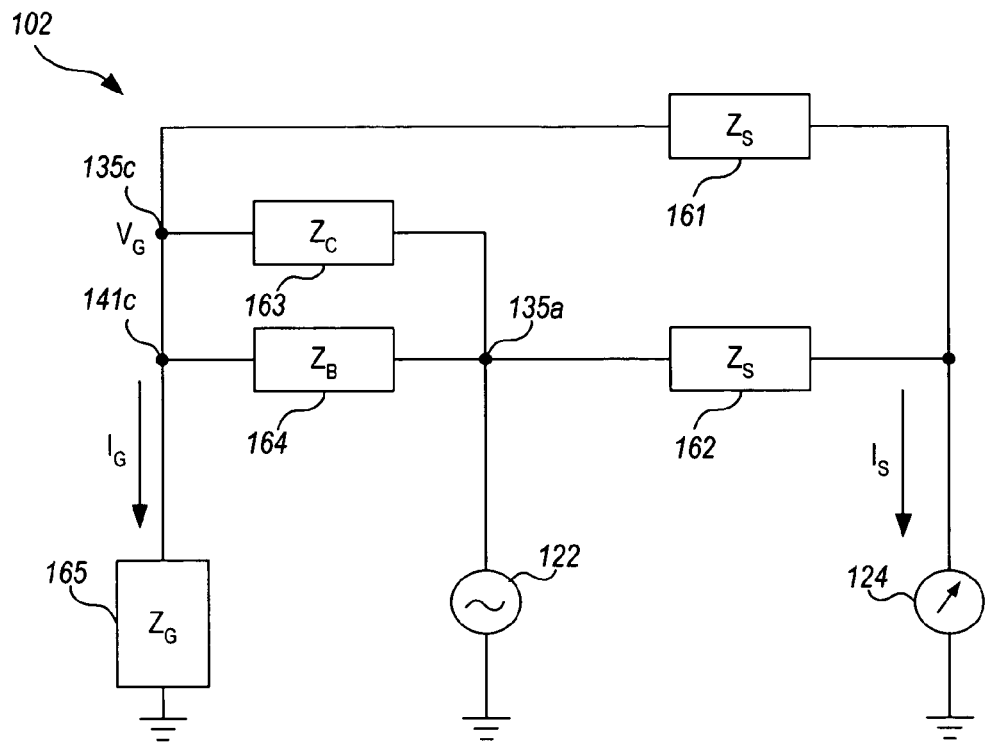
FIG. 3 is a circuit model of the measurement circuit of FIG. 2 when a non-probed node under test does not exhibit an open defect.

In the defect-free model 102 as illustrated in FIG. 3, the various capacitive couplings are modeled by a network of impedances 161, 162, 163, 164, 165 (the AC voltage source frequency and capacitance magnitudes will determine the actual values of these impedances) that supply current to the measurement device 124. (Note these impedances 161, 162, 163, 164, 165 are due to the various coupling capacitances 152c, 152a, 153b, 154, 155, respectively). In this system, there are two general current paths. The first current path flows between the stimulated joint 135a to the measuring device 124 directly through an impedance $Z_s$ 162 due to sense capacitance $C_s$ 152a. The second current path flows between the joint 135c and the measuring device 124 through a divider made up of impedances $Z_C$ 163, $Z_B$ 164, and $Z_G$ 165 to a second impedance $Z_s$ 161 representing the impedance of sense capacitance $C_S$ 152c. If joint 135c had been accessible and grounded, none of this second path current could have made it to the measurement device 124 but would have been diverted to ground 123. Because joint 135c is either not accessible or selected to be non-probed (i.e., not probed by the tester), it therefore cannot be grounded. Thus, capacitive coupling between joint 135a and 135c contributes to the current flow, which increases the current $I_S$ sensed when testing joint 135a. The voltage $V_G$ seen at the divider is related to the source voltage V by the equation:

$$V_G = V*(Z_G*Z_S/(Z_G+Z_S))/((Z_B*Z_C/(Z_B+Z_C))+(Z_G*Z_S/(Z_G+Z_S))).$$

The current measured ($I_s$) can be calculated according to the equation:

$$I_s = (V+V_G)/Z_s.$$

The current measurement can be converted back to a capacitance, referred to herein as the effective capacitance $C_{\mathit{Eff}}$ of the circuit, by dividing the current $I_s$ by V.

Figure 4:
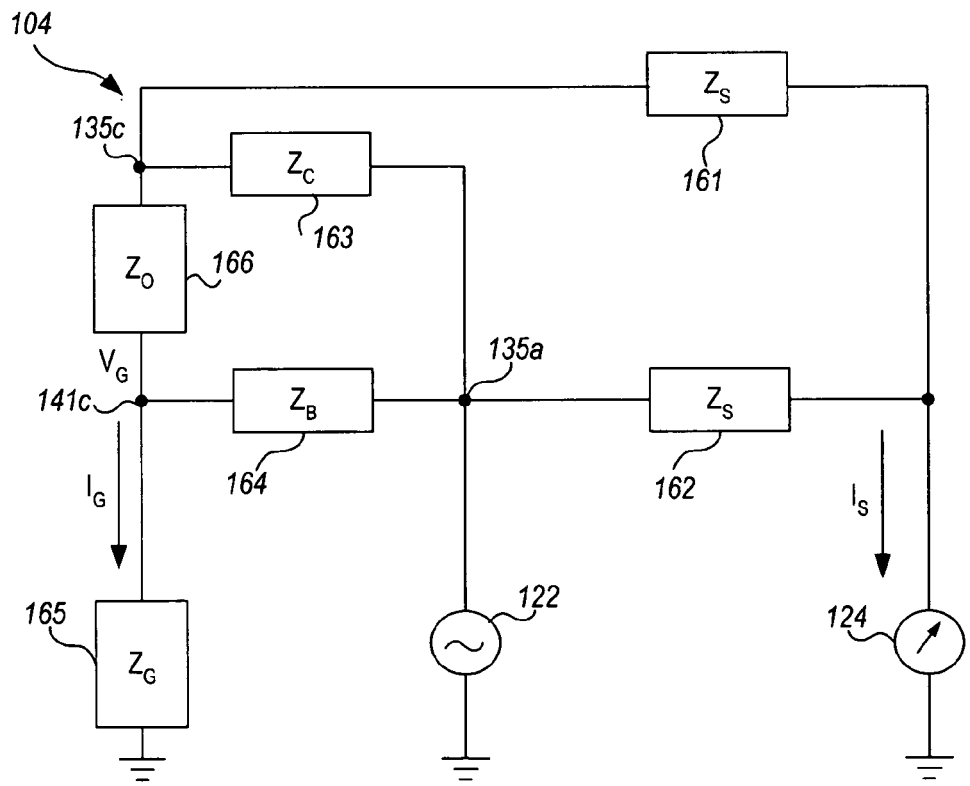
FIG. 4 is a circuit model of the measurement circuit of FIG. 2 when a non-probed node under test exhibits an open defect.

FIG. 4 illustrates the model 104 of the measurement circuit when joint 135c is between node 134c in the DUT 130 and node 141c on the PCB 140 is open. In this scenario, the circuit 104 is similar to the circuit 103 of FIG. 3, but includes an impedance $Z_O$ 166 that is due to the capacitance of the open joint 135c in the network. This capacitance is likely to be small, so the magnitude of $Z_O$ 166 will likely be much larger than the impedance divider circuit comprising $Z_B$ 164 and $Z_G$ 165. Thus, some of the effects of this divider circuit are isolated from the second current path flowing through $Z_S$ 161. When joint 135c is connected (i.e., not open), as in the model of FIG. 3, the impedance divider circuit (comprising $Z_B$ 164, $Z_C$ 163, and $Z_G$ 165) shunts some of this current to ground. However, when the joint 135c is open, less current is shunted to ground, resulting in more current flow across $Z_S$ 161 contributing to the sensed measurement, $I_S$. This current $I_s$ is given by:

$$I_s = 2*(V+V_S)/Z_s$$

where $V_S = (M+J*K*N)/(1+J*L*N)$, where:

$$M = -V*Z_O/Z_B,$$

$$J = Z_B*Z_G/(Z_B+Z_G),$$

$$K = V*((Z_B+Z_C)/Z_B*Z_C),$$

$$L = V*((Z_C+Z_S)/Z_C*Z_S), \text{ and}$$

$$N = 1+(Z_O/Z_B)+(Z_O/Z_G).$$

As before the effective capacitance $C_{\mathit{Eff}}$ measured when joint 135c is open as $I_s$ divided by the source voltage V can be computed. A comparison of $C_{\mathit{Eff}}$ for defect-free model of FIG. 3 and open circuit model of FIG. 4 is shown in the graph in FIG. 5.

Figure 5:
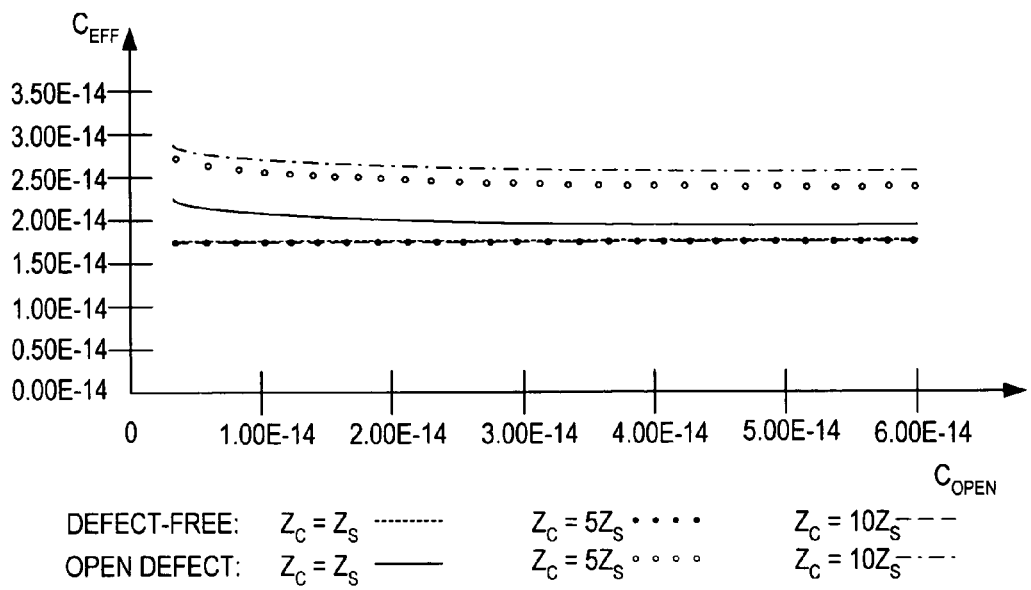
FIG. 5 is a graph illustrating the difference between the effective capacitance in the defect-free and open circuit models of FIGS. 3 and 4.

FIG. 5 shows values of the effective capacitance $C_{\mathit{Eff}}$ for several cases where the coupling capacitance $C_C$ is a multiple (×1, ×5, and ×10) of the sense capacitance $C_S$. The traces for $C_{\mathit{Eff}}$ for defect-free inaccessible joint 135c are all straight horizontal lines that are coincident (i.e., they are nearly independent of $C_C$). The value of $C_{\mathit{Eff}}$ in these cases is 18 fF, where 15 fF was chosen for the sense capacitance $C_S$. The values of $C_B$ and $C_G$ were chosen to be 2 pF and 10 pF, respectively. These values are much larger in practice than couplings internal to an IC. Their ratio (in the example, 5:1) is the important factor as these determine the division ration in the models. Note also that some signals, notably differential pairs, have deliberately engineered coupling capacitances both with respect to each other and to ground. In these cases, their ratio will be predictable.

When the non-probed joint 135c is open, the graph in FIG. 5 illustrates that the three traces corresponding to the three example ratios have significantly higher capacitance than the corresponding traces in the defect-free cases. When the differences between the defect-free and defect measurements exceeds the measurement noise, the presence of an open defect on the non-probed joint 135c can be detected.

The theory described above with respect to FIGS. 3 through 5 can be practically applied to detect the presence or non-presence of open defects on non-probed nodes of electrical devices. The technique can be applied to infer open defects on nodes that are inaccessible to the tester during a given test. In addition, knowledge of the theory imparted above can be used to improve the testing speed of IC devices by deliberately not probing certain neighbor nodes of probed nodes of the device, and simply inferring the presence or non-presence of an open defect on the neighbor nodes of the probed nodes. This decreases the number of directly tested pins, thereby reducing the tester relay multiplexing and measurement overhead to improve throughput.

Figure 6A:
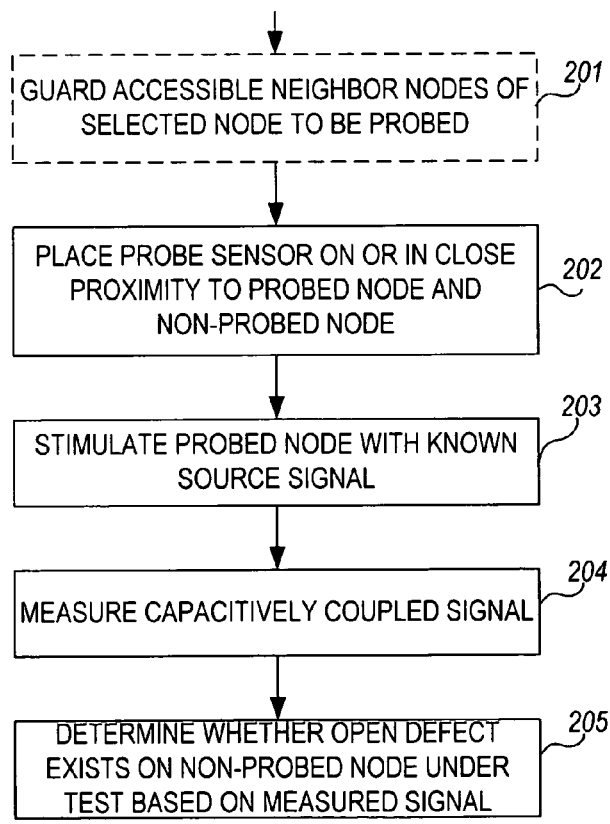
FIG. 6A is a flowchart illustrating a preferred method of the invention for detecting an open defect on a non-probed node under test by inference from a capacitively sensed measurement obtained on a probed neighbor node.

FIG. 6A is a flowchart illustrating a preferred method of the invention for detecting the presence or non-presence of an open defect on an inaccessible or non-probed node of an electrical device under test. In this method, accessible neighbor nodes of a selected node to be probed ("the probed node") are first preferably guarded (e.g., grounded) (step 201). A sensor of a capacitive coupling probe is placed on or in close proximity to at least the probed node and the non-probed node under test of the electrical device (step 202). For example, when the probed node and non-probed node under test are nodes of an integrated circuit, the sensor of the capacitive coupling probe is placed on or in close proximity to the package of the integrated circuit above at least the probed node and the non-probed node under test. The probed node is then stimulated with a known source signal (step 203). A measuring device coupled to the sensor of a capacitive sensing probe measures a capacitively coupled signal generated at least in part by current flow on the probed node and the non-probed node under test (step 204). The capacitively sensed signal is representative of the effective capacitance between the probed node and non-probed node under test. Based on the value of the capacitively sensed signal, an open defect detection function 108 (FIG. 2) can determine whether an open defect exists on the non-probed node under test of the electrical device (step 205).

Figure 6B:
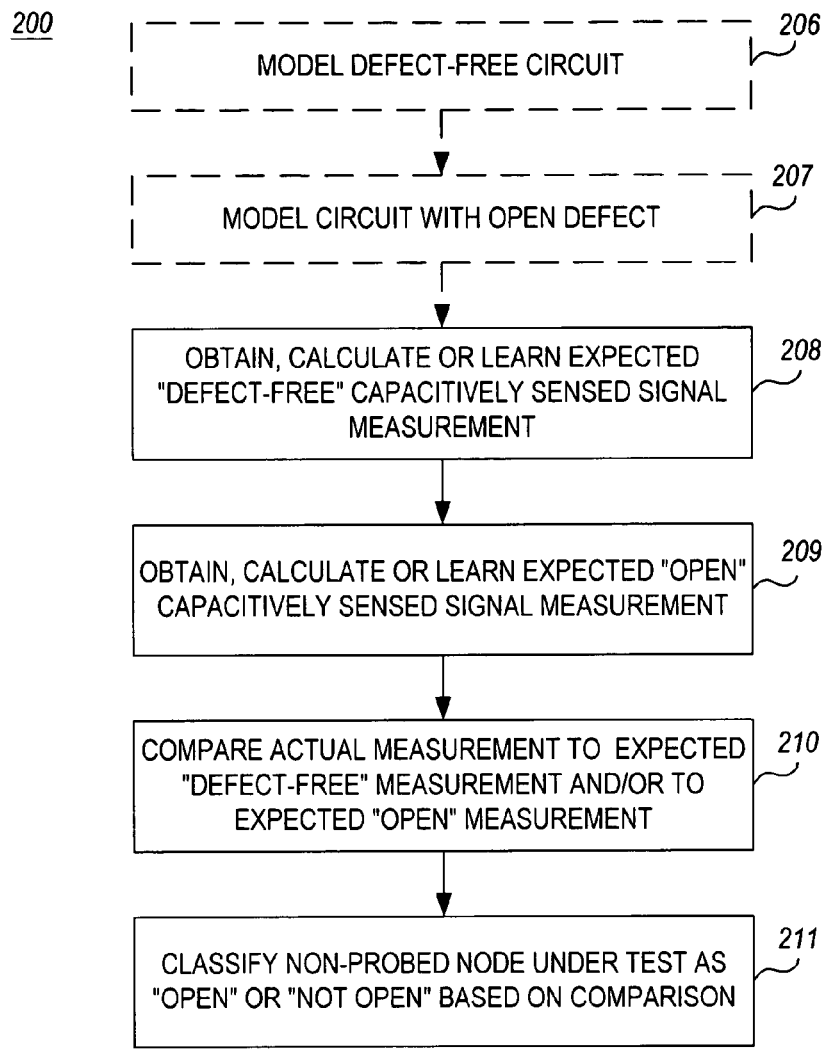
FIG. 6B is an exemplary embodiment for determining whether an open defect exists on a non-probed node under test by inference from a capacitively sensed measurement obtained on a probed neighbor node.

In particular, FIG. 6B illustrates an exemplary embodiment for determining whether an open defect exists on a non-probed node under test of an electrical device under test based on the measurement value of the capacitively coupled signal. In the preferred embodiment, an electrical circuit comprising the probed node and the non-probed node under test of the electrical device, the stimulus source, and the measuring device is modeled in the defect-free case, including the possible capacitive couplings between the various nodes of the modeled circuit (step 206). An illustration of a schematic model that may result from this step as applied to the joints 135*a* and 135*c* of the electrical device 100 of FIG. 2 is shown in FIG. 3 and described in the discussion pertaining thereto. The electrical circuit comprising the probed node and the non-probed node under test of the electrical device, the stimulus source, and the measuring device is also modeled in the open defect case, including the possible capacitive couplings between the various nodes of the modeled circuit, assuming that the non-probed node under test is open (step 207). An illustration of a schematic model that may result from this step this step as applied to the joints 135*a* and 135*c* of the electrical device 100 of FIG. 2 is shown in FIG. 4 and the discussion pertaining thereto. The expected defect-free capacitively sensed signal measurement (effective capacitance, current or voltage) 103 (FIG. 2) that is measured by the measuring device 124 may be calculated using circuit theory for the defect-free case from the defect-free circuit model (as modeled in step 206 of FIG. 6B) (step 208) and the expected open capacitively sensed signal measurement (effective capacitance, current or voltage) 105 (FIG. 2) that is measured by the measuring device 124 may be calculated using circuit theory for the open defect case from the open circuit model (as modeled in step 207 of FIG. 6B) (step 209) to compare against the actual capacitively sensed signal measurement (step 210). Alternatively, the expected "defect-free" capacitively sensed signal measurement 103 may be learned by making measurements on one or more known good boards (i.e., devices under test that are known to be defect free), and using these one or more measurements (or a calculated average of or other statistic derived from the measurements) as the expected "defect-free" capacitively sensed signal measurement 103. Similarly, the expected "open" capacitively sensed signal measurement 105 may be learned by making measurements on one or more devices under test that are known to have the open circuit defect, and using these one or more measurements (or a calculated average of or other statistic derived from the measurements) as the expected "open" capacitively sensed signal measurement 105. The non-probed nodes under test can then be classified by a classifier 106 as "defect-free" if the actual capacitively sensed signal measurement is substantially close to (i.e., within a predetermined guardband of, or within reasonable statistical error of) the expected "defect-free" capacitively sensed signal measurement 103 or as "open" if the actual capacitively sensed signal measurement is substantially close to (i.e., within a guardband of, or within reasonable statistical error of) the expected "open" capacitively sensed signal measurement 105 (step 211). Finally, in the alternative, the expected defect-free capacitively sensed signal measurement 103 and/or the expected open capacitively sensed signal measurement 105 may be obtained from some other source (e.g., simulated design calculations, expert knowledge, etc). Based on the observation from the previous discussion that the measured current $I_S$ or effective capacitance $C_{Eff}$ will be greater if an open exists than if no open exists, in a very simple test, the open defect detection function 106 can merely compare the actual capacitively sensed signal measurement 101 from the device under test to the expected defect-free capacitively sensed signal measurement 103. If the actual capacitively sensed signal measurement 101 is greater than (taking into account measurement error) the expected defect-free capacitively sensed signal measurement 103, then the open defect detection function 106 may conclude that an open exists on the non-probed node under test.

Figure 7:
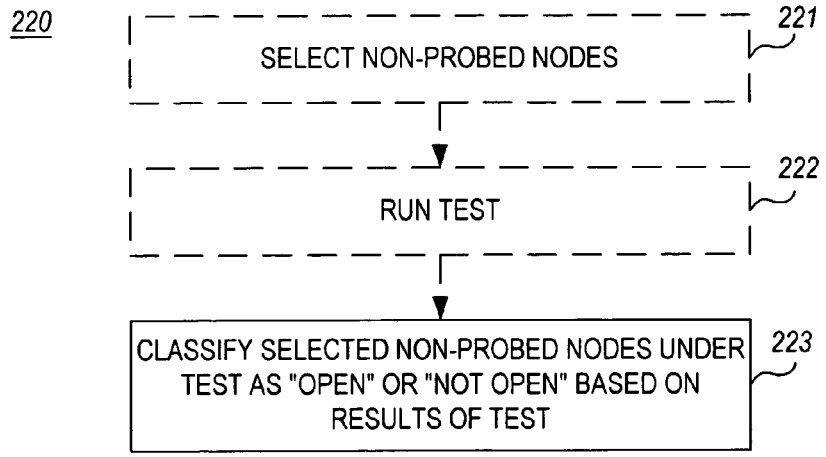
FIG. 7 is a flowchart illustrating a method for achieving higher test coverage based on a reduced set of measurements.

The above technique of detecting open defects on non-probed nodes of a device under test by inference from capacitively coupled signal measurements of neighboring probed nodes of the device under test may be used to detect open defects on nodes of the device under test that are inaccessible to the tester, for example due to an excess of nodes to be tested on the device under test relative to the number and/or positioning of probes and/or resource allocation capability of the tester. The above technique may also be used to reduce the amount of the time required to test a device under test. In this regard, certain nodes of the device under test may be purposely not probed and their status as good or open inferred from measurements of neighboring nodes in order to reduce the number of measurements that the tester must make, resulting in shorter testing times. FIG. 7 illustrates the method for achieving higher test coverage based on a reduced set of measurements. As illustrated, the method includes a step of selecting a set of probes not to be probed ("the non-probed nodes under test") that each respectively neighbors a corresponding node that will be probed during test ("the probed nodes") (step 221). A test is run on the device under test (step 222), and each of the non-probed nodes is then classified as being defect-free or having an open defect based on the capacitively coupled signal measurements obtained when the corresponding probed nodes are stimulated by the known source signal (step 223).

Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. A method for detecting an open defect on a non-probed node under test of an electrical device, the method comprising the steps of:
    stimulating a probed node of the electrical device that neighbors the non-probed node under test with a known source signal;
    capacitively sensing a signal representative of an effective capacitance between the electrical device and a sensor of a capacitive sensing probe; and
    determining whether an open defect exists on the non-probed node under test based on the capacitively sensed signal.

2. A method in accordance with claim 1, comprising the step of:
    guarding accessible neighbor nodes that neighbor the probed node and/or the non-probed node under test.

3. A method in accordance with claim 1, wherein:
    the electrical device comprises an integrated circuit; and
    the probed node comprises an input and/or output joint of the integrated circuit.

4. A method in accordance with claim 1, wherein the step of determining whether an open defect exists comprises the steps of:

obtaining at least one of an expected defect-free capacitively sensed signal measurement and an expected open capacitively sensed signal measurement;

comparing the capacitively sensed signal against the at least one of the expected defect-free capacitively sensed measurement and the expected open capacitively sensed signal measurement; and classifying the non-probed node under test as open or not open based on results of the comparing step.

5. A method in accordance with claim 4, wherein the step of obtaining at least one of the expected defect-free capacitively sensed signal measurement and the expected open capacitively sensed signal measurement comprises the steps of:

if the expected defect-free capacitively sensed signal measurement is obtained:
  modeling a defect-free electrical circuit comprising the non-probed node under test, the probed node, the stimulus source, and the measuring device, wherein the non-probed node under test does not exhibit an open defect;
  calculating the expected defect-free capacitively sensed signal measurement for the defect-free circuit model that would be measured by the measuring device in the defect-free circuit model; and if the expected open capacitively sensed signal measurement is obtained:
  modeling an open electrical circuit comprising the probed node, the non-probed node under test, the stimulus source, and the measuring device, wherein the non-probed node under test exhibits an open defect;
  calculating an expected open capacitively sensed signal measurement for the open circuit model that would be measured by the measuring device in the open circuit model.

6. A method in accordance with claim 4, wherein the step for obtaining at least one of the expected defect-free capacitively sensed signal measurement and the expected open capacitively sensed signal measurement comprises the steps of:

if the expected defect-free capacitively sensed signal measurement is obtained:
  obtaining one or more defect-free capacitively sensed signal measurements on a known good electrical device identical by design to the electrical device, wherein the non-probed node under test is known not to comprise an open defect; and
  basing the expected defect-free capacitively sensed signal measurement on a statistical combination of the one or more defect-free capacitively sensed signal measurements; and obtaining one or more open capacitively sensed signal measurements on an electrical device identical by design to the electrical device but wherein the non-probed node under test is known to comprise an open defect; and
  basing the expected open capacitively sensed signal measurement on a statistical combination of the one or more open capacitively sensed signal measurements.

7. A method in accordance with claim 4, wherein the classifying step comprises:

classifying the non-probed node under test as defect-free if the capacitively sensed signal is substantially close to the expected defect-free capacitively sensed signal measurement; and classifying the non-probed node under test as open if the capacitively sensed signal is substantially close to the expected open capacitively sensed signal measurement.

8. A method in accordance with claim 4, wherein the step for capacitively sensing a signal representative of an effective capacitance between the electrical device and a sensor of a capacitive sensing probe comprises the steps of:

capacitively coupling the sensor of the capacitive sensing probe to at least the nonprobed node under test and the probed node;

coupling a measuring device to the sensor; and sensing, with the measuring device, a capacitively coupled signal between the sensor and the nonprobed node under test and the probed node.

9. A method in accordance with claim 4, wherein:

the electrical device comprises an integrated circuit; and the probed node comprises an input and/or output joint of the integrated circuit.

10. A method in accordance with claim 1, wherein the step for capacitively sensing a signal representative of an effective capacitance between the electrical device and a sensor of a capacitive sensing probe comprises the steps of:

capacitively coupling the sensor of the capacitive sensing probe to at least the non-probed node under test and the probed node;

coupling a measurement device to the sensor; and sensing, with the measuring device, a capacitively coupled signal between the sensor and the non-probed node under test and the probed node.

11. A method in accordance with the claim 10, wherein:

the electrical device comprises an integrated circuit; and the probed node comprises an input and/or output joint of the integrated circuit.

12. An apparatus for detecting an open defect between a non-probed node under test of an electrical device and a probed node of the electrical device, comprising:

a signal source which stimulates the probed node of the electrical device with a known source signal;

a capacitive sensing probe comprising a sensor which capacitively senses a signal representative of an effective capacitance between the sensor and at least the non-probed node under test and the probed node; and an open defect detection function which determines whether an open defect exists on the non-probed node under test based on the capacitively sensed signal.

13. An apparatus in accordance with claim 12, wherein the capacitive sensing probe comprises:

a measuring device coupled to the capacitive sense plate.

14. An apparatus in accordance with claim 13, comprising:

a classification function which receives at least one of an expected defect-free capacitively sensed signal measurement and an expected open capacitively sensed signal measurement, compares the capacitively sensed signal against at least one of the expected defect-free capacitively sensed signal measurement and the expected open capacitively sensed signal measurement, and classifies the non-probed node under test either as exhibiting an open defect or as not exhibiting an open defect based on results of the comparison.

15. An apparatus in accordance with claim 14, wherein:

the classification function classifies the non-probed node under test as not exhibiting an open defect if the capacitively sensed signal is substantially close to the expected defect-free capacitively sensed signal measurement; and the classification function classifies the non-probed node under test as exhibiting an open defect if the capacitively sensed signal is substantially close to the expected open capacitively sensed signal measurement.

16. An apparatus in accordance with claim 14, wherein: the electrical device comprises an integrated circuit; and the probed node and the non-probed node under test each comprise an input and/or output joint of the integrated circuit.

17. A method for generating measurable parameters for determining whether an open defect exists on a non-probed node under test of an electrical device under test, the method comprising the steps of:
   modeling a defect-free electrical circuit comprising a probed node and the non-probed node under test of the electrical device under test, a known stimulus source applied to the probed node, and a measuring device capacitively coupled to the probed node, wherein the non-probed node under test does not exhibit an open defect;
   calculating or learning an expected defect-free capacitively sensed signal measurement for the defect-free circuit model that would be measured by the measuring device in the defect-free circuit model;
   modeling an open electrical circuit comprising the probed node and the non-probed node under test of the electrical device under test, the known stimulus source applied to the probed node, and the measuring device capacitively coupled to the probed node, wherein the non-probed node under test exhibits an open defect; and
   calculating or learning an expected open capacitively sensed signal measurement for the open circuit model that would be measured by the measuring device in the open circuit model.

18. A method in accordance with claim 17, further comprising the steps of:
   comparing one or more actual capacitively sensed signal measurements of the electrical device under test to at least one of the expected defect-free capacitively sensed signal measurement and the expected open capacitively sensed signal measurement; and
   classifying the non-probed node under test either as exhibiting an open defect or as not exhibiting an open defect based on results of the comparison.

19. A method in accordance with claim 17, wherein:
   the electrical device comprises an integrated circuit.

20. A method in accordance with claim 19, wherein:
   the probed node and the non-probed node under test each c comprise an input and/or output joint of the integrated circuit.

21. A method for reducing test time of a capacitive opens test of an electrical device, comprising the steps of:
   selecting for non-probing one or more nodes under test of the electrical device that neighbor one or more nodes to be probed;
   stimulating the one or more nodes to be probed with a known source signal;
   capacitively sensing one or more respective signals representative of one or more corresponding effective capacitances between the electrical device and a sensor of a capacitive sensing probe; and
   determining whether an open defect exists on the non-probed node under test based on the one or more respective capacitively sensed signals.

* * * * *

UNITED STATES PATENT AND TRADEMARK OFFICE
CERTIFICATE OF CORRECTION

| | | |
|---|---|---|
| PATENT NO. | : 7,362,106 B2 | Page 1 of 1 |
| APPLICATION NO. | : 11/170365 | |
| DATED | : April 22, 2008 | |
| INVENTOR(S) | : Parker et al. | |

It is certified that error appears in the above-identified patent and that said Letters Patent is hereby corrected as shown below:

In column 10, line 9, in Claim 8, delete "nonprobed" and insert -- non-probed --, therefor.

In column 10, line 13, in Claim 8, delete "nonprobed" and insert -- non-probed --, therefor.

Signed and Sealed this

Nineteenth Day of August, 2008

JON W. DUDAS
*Director of the United States Patent and Trademark Office*